US008144905B2

(12) United States Patent
Bürger

(10) Patent No.: US 8,144,905 B2
(45) Date of Patent: Mar. 27, 2012

(54) VOLUME CONTROL IN A HEARING AID AND HEARING AID WITH VOLUME CONTROL

(75) Inventor: Christian Bürger, Smørum (DK)

(73) Assignee: Oticon A/S, Smorum (DK)

( * ) Notice: Subject to any disclaimer, the term of this patent is extended or adjusted under 35 U.S.C. 154(b) by 1169 days.

(21) Appl. No.: 11/984,096

(22) Filed: Nov. 13, 2007

(65) Prior Publication Data

US 2008/0101634 A1 May 1, 2008

Related U.S. Application Data

(63) Continuation-in-part of application No. 10/546,680, filed as application No. PCT/DK2004/000083 on Feb. 5, 2004, now abandoned.

(30) Foreign Application Priority Data

Feb. 27, 2003 (DK) ................................ 2003 00313

(51) Int. Cl.
*H04R 25/00* (2006.01)
*H03G 3/00* (2006.01)

(52) U.S. Cl. ....................................... 381/321; 381/109

(58) Field of Classification Search .................. 381/314, 381/315, 321, 104, 109
See application file for complete search history.

(56) References Cited

U.S. PATENT DOCUMENTS 4,679,240 A 7/1987 Heide
5,303,306 A * 4/1994 Brillhart et al. .............. 381/315
5,727,070 A 3/1998 Coninx
5,745,057 A 4/1998 Sasaki et al.

FOREIGN PATENT DOCUMENTS

EP 0311233 4/1989
EP 0297087 12/1998
JP 5130698 5/1993

* cited by examiner

*Primary Examiner* — Brian Ensey
(74) *Attorney, Agent, or Firm* — Dykema Gossett PLLC

(57) ABSTRACT

A volume control in a hearing aid which has a signal path from a microphone to a receiver and which provides amplification of the signal delivered to the receiver, the volume control including first and second user input elements to allow the user to change the amplification in a downward and an upward direction, whereby use of the first and second user input elements has different impact on the size of the amplification change effected.

4 Claims, 2 Drawing Sheets

VOLUME CONTROL IN A HEARING AID AND HEARING AID WITH VOLUME CONTROL

CROSS-REFERENCE TO RELATED APPLICATION

This application is a continuation-in-part of U.S. application Ser. No. 10/546,680, filed Oct. 11, 2005 now abandoned, which was a U.S. national phase application of PCT/DK2004/000083, filed 5 Feb. 2004, which claimed priority of Danish Application No. PA 2003 00313, filed 27 Feb. 2003. The priorities of these applications are claimed.

AREA OF THE INVENTION

People with a hearing loss often maintain the same or nearly the same sensitivity towards loud sounds as people with normal hearing. This means that their dynamic input range is reduced compared to that of people with normal hearing.

Hearing aids try to translate the normal sound pressure range to the reduced range and this is basically done by applying amplification and compression.

This means that wearing a hearing aid will compensate the hearing loss, but the reduced dynamic input range means that sounds will be perceived as too loud in more situations than for the person with a normal hearing.

The simple and often used solution to this problem is to supply the hearing aid with a volume control. The user can then adjust the level so that the level of sound is comfortable.

BACKGROUND OF THE INVENTION

Volume controls will mostly adjust the level a fixed dB value in an upward or downward direction, giving the hearing aid user the capability to adjust the sound level to fit both low and high level environments. The adjustment is often made stepwise with a predefine step size, but can also be purely analogue with infinite steps.

The improvement to the normal volume control, which is proposed here, is to differentiate between adjusting the volume up and down, such that an adjustment to increase the gain will be different from an adjustment to decrease the gain. Many hearing aid users report that they prefer a volume control that is easy accessible because this enables them to turn down the volume faster in environments with too loud sounds.

But to turn the volume down fast also depends on the step size used for the given hearing aid.

It is therefore an advantage to have a large step size when regulating the volume down. In the known hearing aids this means that the upward step size also becomes large because the hearing aids doe not differentiate the step size for up and down regulation.

And the users do not want large step sizes when regulating the volume up, because this increases the risk of adjusting to a too loud volume setting.

SUMMARY OF THE INVENTION

According to the invention the problem is solved by a volume control in a hearing aid, where the hearing aid has a signal path from a microphone to a receiver and where the signal path is adapted to provide an amplification of the signal delivered to the receiver, where a first and a second user input means is provided to allow the user to change the volume delivered by the receiver in a downward and an upward direction whereby use of the first and second user input means has different impact on the size of the volume change effected.

By having one size of the volume change in the upward direction and another size in the downward direction, it becomes possible to have the hearing aid effect a volume change which provides the user with the possibility to fine tune the setting of the volume and at the same time ensures fast reaction to changes in the sound environment.

Preferably the size of the change in the downward direction is bigger than the size of the change in the upward direction. Hereby it is ensured that the user at all times can react quickly to onset of loud sounds in the environment. The invention may be realized with the use of a volume control wheel, whereby the wheel is made to be more sensitive in the down direction than in the up direction.

In an embodiment of the invention the first and second user input means include push buttons, and each activation of the push buttons corresponds to a downward or upward step of the amplification, whereby the size of the volume change by a downward step is bigger than the size of the volume change by an upward step. Push buttons presents a special problem because the user both requires the possibility of accurate adjustment of the volume and at the same time a quick or immediate and adequate reaction to the onset of loud sounds. By having a button function, which reacts with bigger steps in the downward direction than in the upward direction, the user can both effect quick and adequate volume reduction and perform a precise fine tuning of the volume. Here the fine tuning will have to be done in the upward direction.

In an embodiment of the hearing aid according to the invention the step size is programmable. This allows the user to choose the step size for upward and downward adjustment of the volume. The user could for example select 3 dB as the size of the downward steps and 1 dB as the size of the upward steps, and a regulation range of +9 dB. This would mean that there are 6 steps from +9 dB down to −9 dB but 18 steps from −9 dB to +9 dB. This surely offers fast down and fine pitch up volume regulation.

A hearing aid according to the prior art has one register for storing of the step size used for the volume control. This step size is used both for volume up and for volume down action. If the user chooses a large step size in order to allow for quick action of the turning down of the volume, he will have to accept a large pitch, and loss of possibility of fine tuning of the volume setting. If alternatively he chooses a small step size, the step size for turning down the volume will also be small. This means that the volume down button will have to be touched several times to effect adequate damping of the sound by the onset of high sounds in the environment.

TABLE 1

Volume regulation.

Volume 1 step up. Volume 1 step down. Volume 1 step up.

| | Index | Gain Factor | | Index | Gain Factor | | Index | Gain Factor | d | Index | Gain Factor |
|---|---|---|---|---|---|---|---|---|---|---|---|
| | 0 | -4 | | 0 | -4 | | 0 | -4 | → | 0 | -4 |
| | 1 | -3 | | 1 | -3 | c | 1 | -3 | | 1 | -3 |
| | 2 | -2 | | 2 | -2 | → | 2 | -2 | | 2 | -2 |
| a | 3 | -1 | | 3 | -1 | | 3 | -1 | | 3 | -1 |
| → | 4 | 0 | b | 4 | 0 | | 4 | 0 | | 4 | 0 |
| | 5 | 1 | → | 5 | 1 | | 5 | 1 | | 5 | 1 |
| | 6 | 2 | | 6 | 2 | | 6 | 2 | | 6 | 2 |
| | 7 | 3 | | 7 | 3 | | 7 | 3 | | 7 | 3 |
| | 8 | 4 | | 8 | 4 | | 8 | 4 | | 8 | 4 |

Table 1 shows an example of possible gain adjustments in a hearing aid according to the invention. Initially, the Volume Control is set at index 4 (middle of gain table) resulting in a gain of 0 dB. This is indicated by arrow a.

The user then turns the volume control one step up changing the index to 5 (4+1). Volume index 5 corresponds to a gain adjustment of +1 dB, i.e., the volume is increased by 1 dB. This is shown by arrow b. Any gain adjustment in the up-direction will result in a 1 dB increase in the gain setting as long as the setting is within the legal boundaries.

The next step is the user turning the volume control 1 step down whereby the index is changed to 2 (5−3) and the volume is decreased with 3 dB. This is shown at arrow c.

Any gain adjustment in the down direction will result in a 3 dB down adjustment as long as the gain remains within the legal boundaries.

The final table shows that the index must never exceed the minimum (or maximum) limit. This means that the second step down only results in a decrease of 2 dB instead of 3 dB, because the index reaches the lower limit (0). This is shown by arrow d.

DETAILED DESCRIPTION OF THE INVENTION

Figure 1:
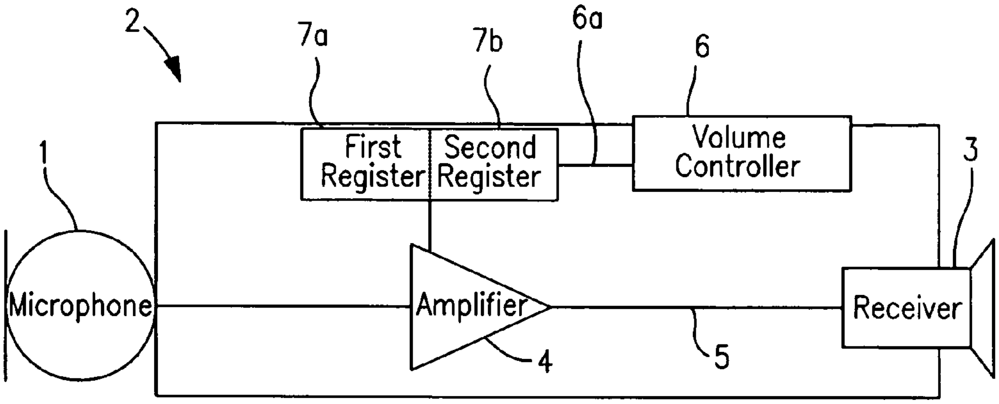
FIG. 1 is a schematic diagram of a hearing aid according to a first embodiment of the present invention.

In FIG. 1 a hearing aid 2 is shown with a volume control 6, a signal path 5 from a microphone 1 to a receiver 3, the signal path 5 including an amplifier 4 to provide an amplification of the signal delivered to the receiver 3. The volume control 6 includes first and second user input means to allow the user to change the volume delivered by the receiver 3 in an upward or downward direction, the first and second user input means having different impact on the size of the volume change effected.

In FIG. 1 a first register 7*a* is provided for holding a user-chosen value for the volume up step size and a second register 7*b* is provided for holding a user-chosen volume down step size value.

When the user wants to turn down the volume of the hearing aid 2, the second user input means of the volume control 6 is touched. The touch of this user input means causes the value at the second register 7*b* to be utilized at the amplifier 4 for turning the volume down a given number of steps according to the value in register 7*b*. If the value in register 7*b* is 2,3 or higher, the use will experience volume reduction a similar number of steps at every touch of the input means. Should the user touch the first input means, the value stored in register 7*a* is used at the amplifier 4 for turning the volume up an according number of steps. In this way it is ensured that at turning the volume down, only a very limited number of inputs to the hearing aid is required to reach the lowermost setting of the volume.

Figure 2:
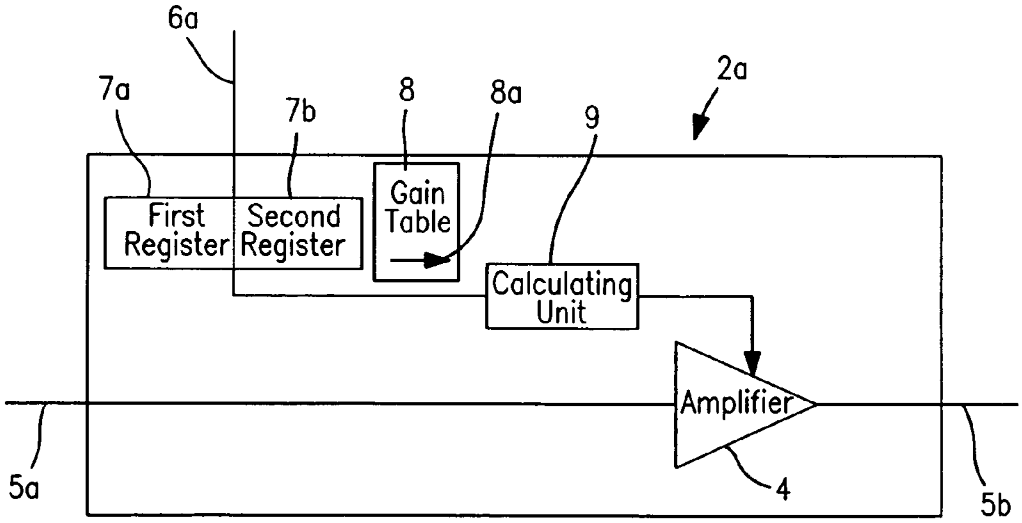
FIG. 2 is a schematic diagram of a signal processing part of a hearing aid according to a second embodiment of the invention.

In FIG. 2 a hearing aid with a different embodiment of the invention is shown. Here only the signal processing part 2*a* of the hearing aid is shown. This processing part receives an input signal from a microphone (not shown in FIG. 2) through input line 5*a* and delivers an output signal to a receiver (not shown in FIG. 2) through output line 5*b* and also an input line 6*a* from a user-operated switch or similar user-input means. The first and second registers 7*a* and 7*b* are provided as in the embodiment shown in FIG. 1. Further, a gain table 8 is provided in the hearing aid signal processing part 2*a*. In the gain table, corresponding gain indexes and gain factors are stored as also explained earlier with respect to table 1. In the signal processing unit 2*a* also a calculating unit 9 is provided. When the hearing aid user contacts one of the input means, a corresponding signal will be provided at input line 6*a*, and if it is the volume up input means which has been touched, the value at 7*a* will read out to calculation unit 9 along with an indicator 8*a* from gain table 8. The indicator will show the present setting of the volume. The calculator unit 9 may now, based on the value from register 7*a*, the indicator, and the information from the user input, calculate a new setting of the volume for the hearing aid. The indicator may be used in the following way:

The actual setting of the volume is high:

a turn down of volume is wished, the value from register 7*a* is used for turning down the volume a corresponding number of indexes, a turn up of volume is wished, the value from register 7*b* is used for turning the volume up a corresponding number of indexes, unless this results in an out of range volume in which case the volume will be set at the highest index, The actual setting of the volume is low:

a turn down of volume is wished, the value from register 7*b* is used for turning the volume down a corresponding number of indexes, unless this results in an out of range volume, in which case the volume will be set at the lowest index, a turn up of volume is wished, the value from register 7*b* is used for turning the volume up a corresponding number of steps.

As indicated by the above, the actual setting of the volume is used to ensure that the turn down using the larger number of steps from register 7*a*, is only used in case a loud volume setting was already set. In the above example, the low volume may be interpreted in accordance with the table 1 display as any volume setting with an index at or below 4, whereas the high volume may be interpreted as any volume setting with an index above 4.

Figure 3:
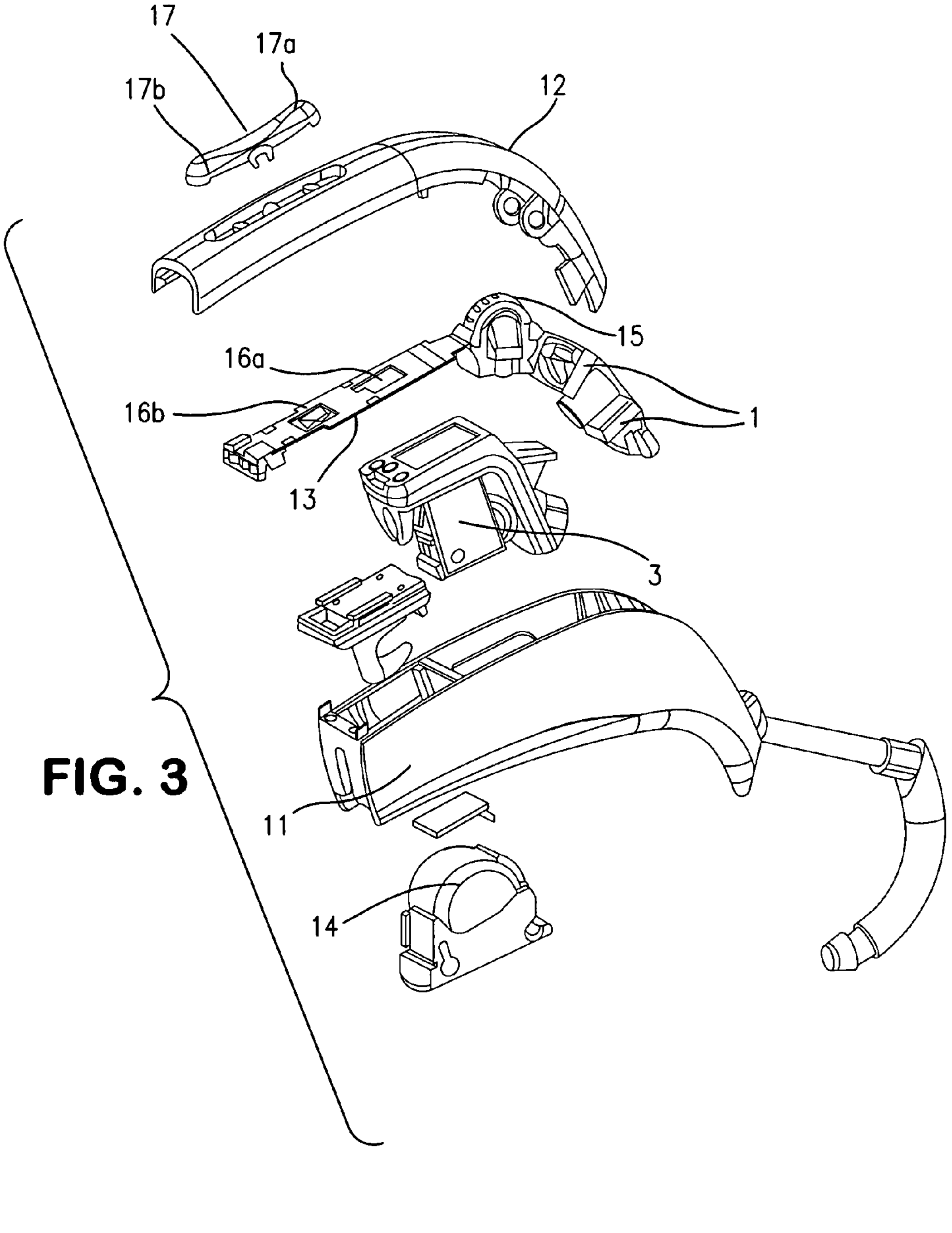
FIG. 3 is an exploded view of a hearing aid according to the invention.

In FIG. 3 an exploded view of a hearing aid with the various parts forming the instrument is displayed. The hearing aid in FIG. 3 comprises a bottom shell 11, and a top shell 12, and a printed circuit board 13 which is to be enclosed between the two shell parts. The printed circuit board 13 is in contact with the transducers and the battery 14. The transducers comprise microphones 1, the speaker 3 and possible wireless antennas. Further, a toggle 17 is provided. When the toggle 17 is operated and pressed at the one end 17*a*, an underlying switch 16*a* provided on the circuit board 13 will be activated and a signal is transmitted to a signal processing device (not visible in FIG. 3) mounted on the circuit board 13. When the toggle 17 is pressed at the other end 17*b*, another switch 16*b* is activated, and a signal is provided to the signal processing device at another input canal. In the figure also a control wheel 15 is disclosed, whereby the user by turning the wheel 15 in one or the other direction may achieve an effect identical to the effect of using the toggle 17. In a hearing aid usually only one of either toggle 17 or wheel 15 will be provided.

The invention claimed is:

1. A volume control system in a hearing aid comprising a microphone, a receiver, a signal path from the microphone to the receiver, the signal path being adapted to provide an amplification of a signal delivered to the receiver, and including a first user input means to enable a user to change the gain factor setting of the amplification in a downward direction and a second user input means to enable the user to change the gain factor setting of the amplification in an upward direction wherein the first and second user input means comprises push buttons and whereby the size of the gain factor change in a downward step and the size of the gain factor change in an upward step corresponds to the contents of a first and a second register respectively, said first and second registers being programmable, and wherein the push buttons comprise a toggle with a movable part operable for movement in one direction in order to cause one downward step of the amplification and operable for movement in a second direction on order to cause one upward step of the amplification.

2. The volume control system in a hearing aid as claimed in claim 1, including a gain table comprising corresponding gain indexes and gain factors, wherein contents of the first register provides the number of the gain index changes to be effected in an upward step and contents of the second register provides the number of gain index changes to be effected in a downward step.

3. A volume control system in a hearing aid comprising a microphone, a receiver, a signal path from the microphone to the receiver, the signal path being adapted to provide an amplification of a signal delivered to the receiver, and including a first user input means to enable a user to change the gain factor setting of the amplification in a downward direction, and a second user input means to enable the user to change the gain factor setting of the amplification in an upward direction wherein the first and second user input means comprises push buttons, and whereby a gain table is provided in the hearing aid comprising corresponding gain indexes and gain factors and wherein the gain table comprise an indicator with the present setting of the gain, and where a calculation unit is provided operative to calculate the change in gain index effected in an upward or a downward step in dependency of the present gain setting according to the indicator as well as the direction of desired change indicated by a user.

4. A method for operating a hearing aid volume control system, comprising the following:

register one of a first or a second user input signal from a first or from a second user input means, and register an actual setting of the volume wherein the following scheme for changing the volume is used:

the actual setting of the volume is high and a first user input signal is registered where after the value from a first register is used for turning down the volume a corresponding number of indexes, the actual setting of the volume is high and a second user input signal is registered, where after a value from a second register is used for turning the volume up a corresponding number of indexes, unless this results in an out of range volume in which case the volume will be set at a highest allowable index, the actual setting of the volume is low and a first user input signal is registered, where after the value from a second register is used for turning the volume down a corresponding number of indexes, unless this results in an out of range volume, in which case the volume will be set at a lowest allowable index, the actual setting of the volume is low and a second user input signal is registered, where after the value from the second register is used for turning the volume up a corresponding number of steps.

* * * * *